United States Patent
Zhang et al.

(10) Patent No.: US 11,959,982 B2
(45) Date of Patent: Apr. 16, 2024

(54) LOW-COST MODULAR LIQUID NITROGEN LOW-TEMPERATURE MULTI-NUCLEAR MAGNETIC RESONANCE PROBE

(71) Applicant: INNOVATION ACADEMY FOR PRECISION MEASUREMENT SCIENCE AND TECHNOLOGY, CAS, Wuhan (CN)

(72) Inventors: Zhi Zhang, Wuhan (CN); Qingjia Bao, Wuhan (CN); Chaoyang Liu, Wuhan (CN); Xinjie Liu, Wuhan (CN); Fang Chen, Wuhan (CN); Jiaxin Wang, Wuhan (CN); Xin Cheng, Wuhan (CN); Maili Liu, Wuhan (CN)

(73) Assignee: INNOVATION ACADEMY FOR PRECISION MEASUREMENT SCIENCE AND TECHNOLOGY, CAS, Wuhan (CN)

( * ) Notice: Subject to any disclaimer, the term of this patent is extended or adjusted under 35 U.S.C. 154(b) by 0 days.

(21) Appl. No.: 18/284,549

(22) PCT Filed: Nov. 10, 2021

(86) PCT No.: PCT/CN2021/129680
§ 371 (c)(1),
(2) Date: Sep. 28, 2023

(87) PCT Pub. No.: WO2023/082073
PCT Pub. Date: May 19, 2023

(65) Prior Publication Data
US 2024/0085502 A1    Mar. 14, 2024

(30) Foreign Application Priority Data
Nov. 9, 2021    (CN) .......................... 202111319366.1

(51) Int. Cl.
*G01R 33/34* (2006.01)
*G01K 7/02* (2021.01)

(52) U.S. Cl.
CPC .......... *G01R 33/3403* (2013.01); *G01K 7/02* (2013.01)

(58) Field of Classification Search
CPC ................ G01R 33/3403; G01R 33/31; G01R 33/34023; G01R 33/34092;
(Continued)

(56) References Cited

U.S. PATENT DOCUMENTS

| 5,258,710 A | 11/1993 | Black et al. |
| 2012/0242335 A1 | 9/2012 | Schett et al. |

FOREIGN PATENT DOCUMENTS

| CN | 102597794 A | 7/2012 |
| CN | 202600122 U | 12/2012 |

(Continued)

OTHER PUBLICATIONS

Marie Poirier-Quinot, et al., Performance of a Miniature High-Temperature Superconducting (HTS) Surface Coil for In Vivo Microimaging of the Mouse in a Standard 1.5T Clinical Whole-Body Scanner, Magnetic Resonance in Medicine, 2008, pp. 917-927, vol. 60.

(Continued)

*Primary Examiner* — Jermele M Hollington
*Assistant Examiner* — Courtney G McDonnough
(74) *Attorney, Agent, or Firm* — Bayramoglu Law Offices LLC

(57) ABSTRACT

A low-cost modular liquid nitrogen low-temperature multi-nuclear magnetic resonance probe includes a Dewar, a pluggable coil and a front-end gain amplifier. The Dewar includes a cylindrical sandwich chamber, the center of the cylindrical sandwich chamber constitutes a room-tempera- (Continued)

ture chamber, a sandwich of the cylindrical sandwich chamber is divided into a vacuum chamber and a liquid nitrogen chamber by a liquid nitrogen vessel wall, the vacuum chamber is located between the room-temperature chamber and the liquid nitrogen chamber, the pluggable coil and the front-end gain amplifier are provided in the vacuum chamber, the pluggable coil comprises a coil portion and a pluggable base, the coil portion is in pluggable connection with the pluggable base, and the pluggable coil is connected with the front-end gain amplifier. The probe realizes the transmission of radio frequency pulses and the reception of magnetic resonance signals, and is applicable to whole-body imaging of a small animal.

1 Claim, 2 Drawing Sheets

(58) Field of Classification Search
CPC ............ G01R 33/3804; G01R 33/3815; G01R 33/34069; G01R 33/34076; G01R 33/3635; G01R 33/30; G01R 33/34015; G01R 33/34; G01R 33/28; G01R 33/307; G01R 33/34061; G01R 33/341; G01R 33/3415; G01R 33/282; G01R 33/3802; G01R 33/3873; G01R 33/3875; H01F 6/04; H01F 6/06; F17C 2221/07; F25D 19/006; F25D 3/00; F25D 9/00; F25D 17/00; F25D 19/00; F25D 16/00; F25D 2317/00; F25D 2201/00
USPC .......................................................... 324/307
See application file for complete search history.

(56) References Cited

FOREIGN PATENT DOCUMENTS

| CN | 112129800 A | 12/2020 |
|----|-------------|---------|
| CN | 112397271 A | 2/2021 |
| JP | 2006337107 A | 12/2006 |
| JP | 2008241493 A | 10/2008 |

OTHER PUBLICATIONS

Bobo Hu, et al., A Novel Receive-Only Liquid Nitrogen (LN2)-Cooled RF Coil for High-Resolution In Vivo Imaging on a 3-Tesla Whole-Body Scanner, IEEE Transactions on Instrumentation and Measurement, 2012, pp. 129-139, vol. 61, No. 1.
Ibrahim A. Elabyad, et al., First In Vivo Potassium-39 (39K) MRI at 9.4 T Using Conventional Copper Radio Frequency Surface Coil Cooled to 77 K, IEEE Transactions on Biomedical Engineering, 2014, pp. 334-345, vol. 61, No. 2.

LOW-COST MODULAR LIQUID NITROGEN LOW-TEMPERATURE MULTI-NUCLEAR MAGNETIC RESONANCE PROBE

CROSS REFERENCE TO THE RELATED APPLICATIONS

This application is the national phase entry of International Application No. PCT/CN2021/129680, filed on Nov. 10, 2021, which is based upon and claims priority to Chinese Patent Application No. 202111319366.1, filed on Nov. 9, 2021, the entire contents of which are incorporated herein by reference.

TECHNICAL FIELD

The present invention relates to the technical field of nuclear magnetic resonance instruments, in particular to a low-cost modular liquid nitrogen low-temperature multi-nuclear magnetic resonance probe adapted for a nuclear magnetic resonance imager or nuclear magnetic resonance spectrometer for enabling excitation and acquisition of magnetic resonance signals of different kinds of nuclei in a liquid nitrogen low-temperature state.

BACKGROUND

The nuclear magnetic resonance probe device is an indispensable part of nuclear magnetic resonance instrument, which is used to realize the functions of radio frequency pulse transmission and reception. With the continuous expansion of the field of nuclear magnetic resonance technology, the nuclear magnetic resonance instrument system is increasingly developing towards multi-nuclide acquisition and rapid acquisition. These new requirements put forward higher requirements for the probe of nuclear magnetic resonance instrument. On one hand, it is required to speed up the acquisition speed and improve the experimental efficiency, on the other hand, it is required to improve the signal-to-noise ratio to improve the imaging quality.

In conventional magnetic resonance imaging experiments, as the physical size of the imaged object decreases or the detection frequency decreases, the contribution of noise is often dominant, mainly as the thermal noise in the coils and device conductors has an increasing influence on the signal-to-noise ratio. As the temperature of the coil (including the preamplifier) decreases, the signal-to-noise ratio increases.

Bruker, a commercial magnetic resonance instrument provider, currently proposes a cryocoil solution for small animal imaging, by which the coil is cooled to 30 K via a helium closed loop system, which requires a refrigerator to be attached to the coil and in close proximity to a magnetic resonance scanner, and also requires the application of a powerful heat source at an animal site, resulting in a high thermal gradient (>220° C.) from the coil to the sample. Experimental results show that the signal-to-noise gain on the room temperature coil is highly dependent on the sample and resonant frequency. It is reported that the mouse brain signal-to-noise ratio increased by 2.0-2.2 times at 200 MHz, mouse brain signal-to-noise ratio increased by 2.4-2.5 times at 400 MHz, the mouse heart signal-to-noise ratio increased by 3.0-4.0 times at 400 MHz, and the mouse brain signal-to-noise ratio increased by 3.0-3.5 times at 100 MHz, and these test results strongly indicate a great potential of the low-temperature probe in improving the signal-to-noise ratio.

However, this solution requires extremely high economic costs, making it difficult to apply it more widely. The use of some liquid nitrogen as a coolant rather than a dedicated liquid helium refrigerant is a better option for small coils used for animal magnetic resonance imaging because the economic cost of liquid nitrogen is relatively low. It is reported in the literature that Elabyad et al. immersed the coil directly in liquid nitrogen and placed a solid insulation layer around the coil to obtain a signal-to-noise ratio gain of 2.7 times of rat heart (resonance frequency 18.68 MHz). Hu et al. proposed a more complicated method with vacuum chamber insulation, and the results showed that the signal-to-noise ratio gain of the mouse brain was 1.6 times under 3 T magnetic field. However, in this case, vacuum pumping was required to maintain insulation during the experiment. Poirier-Quinot et al. proposed an automatic thermostat with a thermostatic time of 5 hours, which is used for cooling a superconducting coil, but the practical benefits of low-temperature coils are limited for in vivo imaging of larger objects due to the increased distance from the superconducting coil to the sample and the possible degradation of flexibility caused by the cryostat.

In conclusion, the signal-to-noise ratio can be improved 2-4 times by lowering the temperature of the probe (including coil, preamplifier, etc.). However, in order to achieve a wider application, it is required not only to reduce the cost as much as possible while ensuring the signal-to-noise ratio gain, but also to balance the robustness and flexibility of the probe. However, the low-cost low-temperature magnetic resonance probe meeting the above-mentioned design requirements has not been reported in the literature at present, belongs to the technical blank field, and is a key problem to be solved urgently in the technical field of nuclear magnetic resonance instruments.

SUMMARY

In view of the above-mentioned deficiencies in the prior art, the present invention proposes a low-cost modular liquid nitrogen low-temperature multi-nuclear magnetic resonance probe, which is designed in a modular manner so that the coil and preamplifier can be replaced under different nuclear imaging experiments, with the potential to be extended to clinical applications.

The above object of the present invention is achieved by the following technical solution:
  a low-cost modular liquid nitrogen low-temperature multi-nuclear magnetic resonance probe including a Dewar, and further including a pluggable coil and a front-end gain amplifier, wherein the Dewar includes a cylindrical sandwich chamber, the center of the cylindrical sandwich chamber constitutes a room-temperature chamber, a sandwich of the cylindrical sandwich chamber is divided into a vacuum chamber and a liquid nitrogen chamber by a liquid nitrogen vessel wall, and the vacuum chamber is located between the room-temperature chamber and the liquid nitrogen chamber;
  the pluggable coil and the front-end gain amplifier are provided in the vacuum chamber, the pluggable coil includes a coil portion and a pluggable base, the coil portion is in pluggable connection with the pluggable base, and the pluggable coil is connected with the front-end gain amplifier.

Both the pluggable base of the coil and the front-end gain amplifier as described above are connected to the liquid nitrogen vessel wall by low-temperature glue.

The vacuum chamber as described above is connected with a gas gate provided on an end face of the cylindrical sandwich chamber, the liquid nitrogen chamber is respectively connected to a detachable connection port and an exhaust port provided on the end face of the cylindrical sandwich chamber, and the front-end gain amplifier is respectively connected to a coaxial cable interface and a direct-current power supply interface provided on the end face of the cylindrical sandwich chamber.

A tuning rod interface is provided on an end face of the cylindrical sandwich chamber as described above, the tuning rod is connected with the tuning rod interface via a thread, and the tuning rod extends into the vacuum chamber near the coil portion of the pluggable coil.

The room temperature chamber as described above is provided with a thermocouple, the vacuum chamber is internally provided with a thermocouple in the vicinity of the coil portion of the pluggable coil, the vacuum chamber is internally provided with a thermocouple in the vicinity of the front-end gain amplifier, the end face of the cylindrical sandwich chamber is provided with a thermocouple interface, and each thermocouple is connected with the thermocouple interface.

The cylindrical sandwich chamber described above is glass fiber reinforced plastics and the liquid nitrogen vessel wall is made of ceramic.

An activated carbon and a sodium aluminosilicate are provided within the vacuum chamber as described above.

A side wall of the liquid nitrogen vessel wall in the vacuum chamber as described above is provided with a polyimide thermal insulation layer at a position except for a position corresponding to the pluggable coil.

The pluggable base as described above is made of copper.

The present invention has the following advantages over the prior art:

1. The distance between the coil portion of the pluggable coil and the liquid nitrogen vessel wall is 2.5 mm, which is 3.5 mm preferable than the existing instrument, and can effectively improve the signal-to-noise ratio and image quality;
2. Low-cost design and operation can be achieved, which is an order of magnitude lower than low-temperature coil design and operation using liquid helium as the refrigerant.
3. Applicable to whole body imaging of animals, the diameter of a room temperature chamber is 32 mm, applicable to whole body of mouse and head of rat;
4. Designed in a modular way to replace the coil portion of the pluggable coil and the front-end gain amplifier as needed under different nuclear imaging experiments;
5. The cooling time of the coil portion of the pluggable coil shall be less than 3 hours, so that the liquid nitrogen is not completely volatilized within the test time of 5 hours.

In the figure: 1-Dewar; 2-pluggable coil; 3-front-end gain amplifier; 4-liquid nitrogen vessel wall; 5-room temperature chamber; 6-thermocouple; 7-detachable connection port; 8-exhaust port; 9-gas gate; 10-thermocouple connection; 11-coaxial cable interface; 12-tuning rod interface; 13-DC power interface; 14-vacuum chamber; 15-liquid nitrogen chamber.

DETAILED DESCRIPTION OF THE EMBODIMENTS

In order that a person skilled in the art may understand and practice the present invention, a further detailed description of the invention follows, in conjunction with examples. It is to be understood that the examples described herein are for purposes of illustration and description only and are not intended to be limiting.

Embodiment 1

Figure 1:
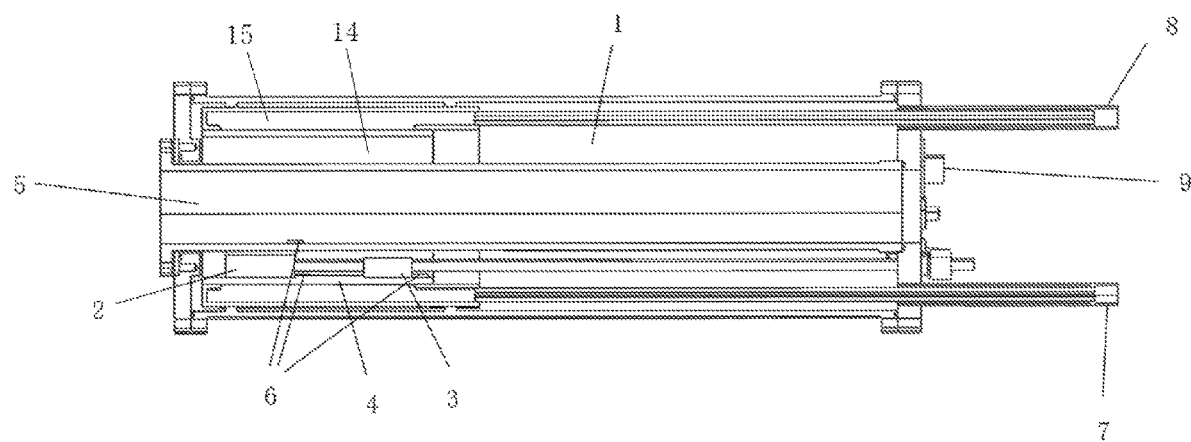
FIG. 1 is a schematic cross-sectional diagram showing the structure according to the present invention.

As shown in FIG. 1, a low-cost modular liquid nitrogen low-temperature multi-nuclear magnetic resonance probe is of modular design, including a Dewar 1, a pluggable coil 2 and a front-end gain amplifier 3.

The Dewar 1 includes a cylindrical sandwich chamber, wherein the center of the cylindrical sandwich chamber forms a room temperature chamber 5, and the interlayer of the cylindrical interlayer chamber is divided into an inner and an outer cylindrical interlayer by a cylindrical liquid nitrogen vessel wall 4, respectively being a vacuum chamber and a liquid nitrogen chamber, and the vacuum chamber is located between the room temperature chamber 5 and the liquid nitrogen chamber. When the probe is working, the liquid nitrogen chamber is filled with liquid nitrogen, and the vacuum chamber is to be vacuumed by a vacuum pump, a ceramic material is used for the liquid nitrogen vessel wall 4 inside the Dewar 1, and an end face of the cylindrical sandwich chamber is provided with a detachable connection port 7, an exhaust port 8, a gas gate 9, two thermocouple interfaces 10, two coaxial cable interfaces 11, two tuning rod interfaces 12 and a direct current power supply interface 13. The DC power interface 13 adopts a two-core aviation plug, the thermocouple interface 10 adopts a two-core aviation plug, and the outer diameter of the tuning rod interface 12 is 5 mm.

The liquid nitrogen chamber is connected with a detachable connection port 7 for connecting to a self-pressurizing liquid nitrogen supply system for replenishing the liquid nitrogen in the liquid nitrogen chamber. The liquid nitrogen chamber is also connected to an exhaust port 8 for exhausting liquid nitrogen or nitrogen volatilized from the liquid nitrogen. The vacuum chamber is connected with a gas gate 9 for connecting to a vacuum pump for evacuating air in the vacuum chamber to reduce heat loss due to heat exchange between the inside and the outside.

The pluggable coil 2 includes a coil portion and a pluggable base, the coil portion and the pluggable base are in a pluggable connection, the pluggable base of the pluggable coil 2 is connected with a liquid nitrogen vessel wall 4, the liquid nitrogen vessel wall 4 divides a vacuum chamber and a liquid nitrogen chamber, the pluggable coil 2 is located in the vacuum chamber, the pluggable base of the pluggable coil 2 fixes the pluggable base to the liquid nitrogen vessel wall 4 via low-temperature glue which is an ultra-low-temperature epoxy resin material, and in this fixing mode, the temperature of the pluggable coil 2 is reduced due to better heat conduction. The distance between the coil portion of the pluggable coil and the liquid nitrogen vessel wall is 2.5 mm, which is 3.5 mm preferable than the existing instrument, and can effectively improve the signal-to-noise ratio and image quality.

The outside of the coil portion of the pluggable coil 2 is provided with a thermocouple connected to the thermocouple interface 10 to monitor the temperature of the coil portion of the pluggable coil 2 via the thermocouple;

the coil portion of the pluggable coil 2 is connected with a coaxial cable interface 11 via a front-end gain amplifier 3, and the coaxial cable interface 11 outputs the acquired magnetic resonance signal;

the tuning rod is connected with the tuning rod interface 12 via a screw thread, and the tuning rod extends to a coil close to the pluggable coil 2 in the vacuum chamber for adjusting the resonance frequency and adjusting matching;

the front-end gain amplifier 3 is connected with a direct-current power interface 13, and the power supply supplies power to the front-end gain amplifier 3 via the direct-current power interface 13;

the Dewar 1 is of a cylindrical design, the low-temperature Dewar 1 includes a room-temperature chamber 5 and a cylindrical sandwich chamber sleeved outside the room-temperature chamber 5, the cylindrical sandwich chamber is divided into a vacuum chamber and a liquid nitrogen chamber by a cylindrical liquid nitrogen vessel wall 4, the cylindrical sandwich chamber is made of a fiber reinforced plastic (glass fiber reinforced plastic), the liquid nitrogen vessel wall 4 is made of a ceramic material, the vacuum chamber is located between the room-temperature chamber 5 and the liquid nitrogen chamber, the liquid nitrogen chamber is used for storing liquid nitrogen and preventing liquid nitrogen from volatilizing, the vacuum chamber is used for isolating heat exchange between the inside and the outside, and a pluggable coil 2 and a front-end gain amplifier 3 are placed in the vacuum chamber; the material of Dewar 1 is fiber reinforced plastic (glass fiber reinforced plastic).

The pluggable coil 2 is used for transmitting radio frequency pulses and receiving magnetic resonance signals, and adopting a modular design, including a coil portion and a pluggable base, wherein the coil portion and the pluggable base are in a pluggable connection to facilitate replacing the coil portion according to the requirements of different experiments.

The front-end gain amplifier 3 is used for adjusting the received gain of the magnetic resonance radio frequency signal received by the coil portion of the pluggable coil 2, and outputting the magnetic resonance radio frequency signal with the received gain adjusted to a cabinet via a coaxial cable interface 11 for further processing, and finally storing same in a computer; and it is also used for receiving a coil excitation signal via a coaxial cable interface 11, and exciting the coil portion of the pluggable coil 2 according to the coil excitation signal, wherein a front-end gain amplifier 3 is provided in a vacuum chamber, and is connected with a liquid nitrogen vessel wall 4 by low-temperature glue.

The liquid nitrogen vessel wall 4 is made of a ceramic material, is relatively low in cost, and has good thermal conductivity in the vicinity the temperature of the liquid nitrogen; the liquid nitrogen vessel wall 4 is connected with a pluggable base and a front-end gain amplifier 3 of a pluggable coil 2; the liquid nitrogen vessel wall 4 divides a vacuum chamber and a liquid nitrogen chamber; the pluggable base and the front-end gain amplifier 3 of the pluggable coil 2 are both fixed to the liquid nitrogen vessel wall 4 by low-temperature glue; and this fixing mode enables the temperature of the pluggable coil 2 and the front-end gain amplifier 3 to be reduced due to a better thermal conductivity effect. The pluggable coil 2 and the front-end gain amplifier 3 are enabled to reach the desired temperature.

The room temperature chamber 5 is used for placing samples, with a diameter of 32 mm, can also be applicable to experiments carried out on the body of a mouse and the head of a rat, and can maintain the vital signs of small experimental animals;

The detachable connection port 7 is used for connecting the liquid nitrogen chamber with a self-pressurized liquid nitrogen supply system to replenish liquid nitrogen reduced by volatilization to ensure the temperature of the probe during the experiment time.

The exhaust port 8 is used for removing volatilized nitrogen in the liquid nitrogen chamber and ensuring the pressure and space of the liquid nitrogen chamber, so that it is easier to replenish new liquid nitrogen.

The gas gate 9 is used for connecting to a vacuum pump to draw out air in the vacuum chamber, wherein the air pressure drawn out to the vacuum chamber is about $10^{-5}$ pa, thereby reducing heat loss caused by heat exchange between the inside and the outside.

The thermocouple interface 10 uses a two-core aviation plug for connecting a thermocouple; the thermocouple located at the room temperature chamber 5 is used for monitoring the temperature at the room temperature chamber 5 to ensure that the temperature is always at a temperature suitable for the survival of small animals; the thermocouple located near the coil portion of the pluggable coil 2 is used for monitoring the temperature near the coil portion of the pluggable coil 2 to ensure that the coil portion is always in a low-temperature state; the thermocouple located near the front-end gain amplifier 3 is used for monitoring the temperature of the front-end gain amplifier 3 to ensure that the front-end gain amplifier 3 is always in a low-temperature state. The thermocouple interface 10 is located on the end cap of the cylindrical sandwich chamber.

The coaxial cable interface 11 is used for connecting a coaxial cable; the front-end gain amplifier 3 is connected with an external cabinet via a coaxial cable interface 11 for transmitting magnetic resonance signals out and receiving externally input coil excitation signals.

The tuning rod interface 12 with an outer diameter of 5 mm, a tuning rod is connected with the tuning rod interface 12 via a thread, and the tuning rod extends into the vacuum chamber near the coil portion of the pluggable coil 2 for adjusting the resonance frequency and adjusting matching.

The direct-current power supply interface 13 uses a two-core aviation plug for connecting a power supply and providing a power supply for the front-end gain amplifier 3, and is located on the end cover of the cylindrical sandwich chamber.

Figure 2:
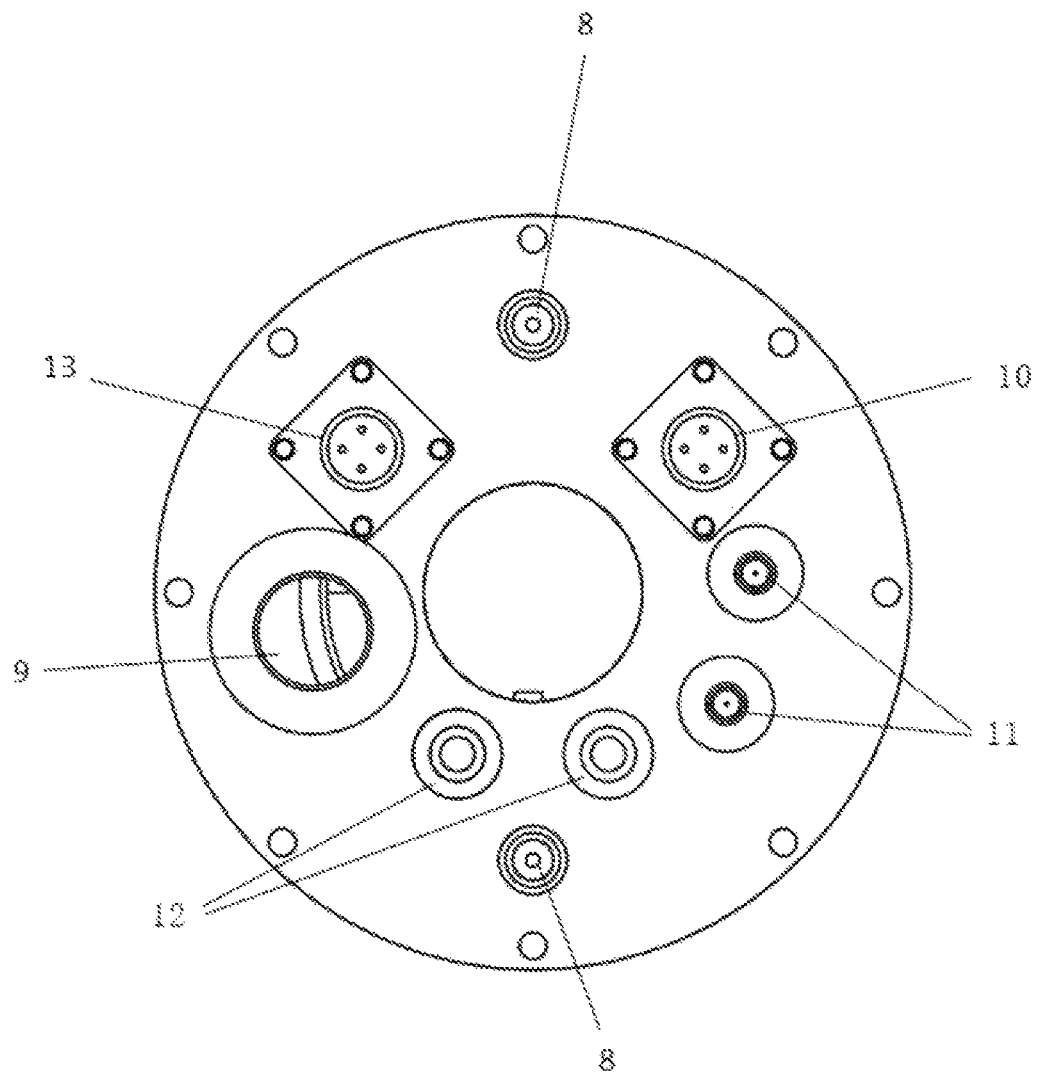
FIG. 2 is a schematic side view showing the structure according to the present invention.

The principle schematic diagram of the invention is shown in FIGS. 1 and 2. The room temperature chamber 5 and the cylindrical sandwich chamber of the Dewar 1 are mainly made of glass fiber reinforced plastic, also called glass fiber reinforced plastic, which does not interfere with radio frequency signals. The Dewar consists mainly of two parts: one part is a room temperature chamber and the other part is a cylindrical sandwich chamber located outside the room temperature chamber in which a sample or a small animal can be placed. The liquid nitrogen chamber and the self-pressurizing liquid nitrogen supply system are connected by a detachable connection port, which allows liquid nitrogen to flow from the self-pressurizing liquid nitrogen supply system to the liquid nitrogen chamber and to be filled, and the geometric volume of the liquid nitrogen chamber is about 8 L. In addition, a bag of activated carbon and a bag of sodium aluminosilicate (about 100 ml) are placed in the vacuum chamber in good thermal contact with the wall 4 of the liquid nitrogen vessel, and these activated carbon and sodium aluminosilicate act as molecular sieves capable of absorbing small molecules that enter the vacuum chamber during cooling or that enter the vacuum chamber during venting, thereby extending the vacuum holding time of the vacuum chamber, thereby ensuring a heat preservation effect. In addition to the vacuum chamber for thermal insulation, other thermal insulation layers are installed to minimize the radiation heat loss, and the side wall of the liquid nitrogen vessel wall 4 located in the vacuum chamber is provided with a polyimide thermal insulation layer for thermal insulation except for the position corresponding to the pluggable coil 2 to avoid eddy currents and interference with the reception of magnetic resonance radio frequency signals by the pluggable coil 2.

The liquid nitrogen chamber and the vacuum chamber are separated by a liquid nitrogen vessel wall 4, and the ceramic (with a purity of 99.6%) is selected as the material of the liquid nitrogen vessel wall 4, on one hand because of its relatively low-cost, and on the other hand because of the good thermal conductivity of the ceramic in the vicinity the temperature of the liquid nitrogen, with the optimum temperature being about 80 K to 90 K; the length of the liquid nitrogen vessel wall 4 is 100 mm to facilitate the installation of other components at a later stage; and a pluggable base of the pluggable coil 2 and a front-end gain amplifier 3 are also connected to the liquid nitrogen vessel wall 4, so that the pluggable coil 2 and the front-end gain amplifier 3 reach a desired temperature. There is a temperature gradient between the liquid nitrogen chamber and the room temperature chamber 5, wherein the liquid nitrogen chamber has a partially low-temperature transferred through the liquid nitrogen vessel wall 4 to ensure the normal operation of the coil portion of the pluggable coil 2 and the front-end gain amplifier 3, and the room temperature chamber 5 is maintained at room temperature to ensure the activity of a sample or a small animal, and in this case, the room temperature is maintained at the position of the animal using a method of introducing a hot gas stream.

The low-temperature Dewar cooling process is accomplished using the following steps:

1. Low temperature Dewar vacuum accumulation: the vacuum chamber is evacuated of air by a vacuum pump to a pressure below $10^{-5}$ Pa.
2. Start of cooling process: 8 L of liquid nitrogen is injected into the liquid nitrogen chamber through a self-pressurized liquid nitrogen supply system.
3. Cooling transition period: after 45 minutes, the vacuum chamber can be disconnected from the vacuum pump.
4. The temperature of the pluggable coil is stable.

The pluggable base of the pluggable coil 2 is made of flat (1.2 mm thick) copper to maximize the contact area with the liquid nitrogen vessel wall 4, and low-temperature glue is used to connect the pluggable base of the pluggable coil 2 with the liquid nitrogen vessel wall 4 to increase the heat transfer therebetween. The front-end gain amplifier 3 is connected by low-temperature glue to the liquid nitrogen vessel wall 4 which is in direct contact with the liquid nitrogen, thus ensuring heat transfer between them.

The specific embodiments described herein are merely illustrative of the spirit of the invention. Various modifications or additions may be made to the specific embodiments described or may be substituted in a similar manner by a person skilled in the art without departing from the spirit of the invention or exceeding the scope thereof as defined by the appended claims.

What is claimed is:

1. A low-cost modular liquid nitrogen low-temperature multi-nuclear magnetic resonance probe, comprising a Dewar, a pluggable coil and a front-end gain amplifier, wherein the Dewar comprises a cylindrical sandwich chamber, a center of the cylindrical sandwich chamber constitutes a room-temperature chamber, a sandwich of the cylindrical sandwich chamber is divided into a vacuum chamber and a liquid nitrogen chamber by a liquid nitrogen vessel wall, and the vacuum chamber is located between the room-temperature chamber and the liquid nitrogen chamber;

the pluggable coil and the front-end gain amplifier are provided in the vacuum chamber, the pluggable coil comprises a coil portion and a pluggable base, the coil portion is in pluggable connection with the pluggable base, and the pluggable coil is connected with the front-end gain amplifier;

the pluggable base of the pluggable coil and the front-end gain amplifier are connected to the liquid nitrogen vessel wall by means of low-temperature glue;

the vacuum chamber is connected with a gas gate provided on an end face of the cylindrical sandwich chamber, the liquid nitrogen chamber is respectively connected to a detachable connection port and an exhaust port provided on the end face of the cylindrical sandwich chamber, and the front-end gain amplifier is respectively connected to a coaxial cable interface and a direct-current power supply interface provided on the end face of the cylindrical sandwich chamber;

a tuning rod interface is provided on the end face of the cylindrical sandwich chamber, a tuning rod is connected with the tuning rod interface via a thread, and the tuning rod extends into the vacuum chamber near the coil portion of the pluggable coil;

the room temperature chamber is provided with a thermocouple, the vacuum chamber is internally provided with a thermocouple in a vicinity of the coil portion of the pluggable coil, the vacuum chamber is internally provided with a thermocouple in a vicinity of the front-end gain amplifier, the end face of the cylindrical sandwich chamber is provided with a thermocouple interface, and each thermocouple is connected with the thermocouple interface;

the cylindrical sandwich chamber is made of glass fiber reinforced plastic, and the liquid nitrogen vessel wall is made of ceramic;

the vacuum chamber is internally provided with activated carbon and sodium aluminosilicate;

a side wall of the liquid nitrogen vessel wall in the vacuum chamber is provided with a polyimide thermal insulation layer at a position except for a position corresponding to the pluggable coil; and the pluggable base is made of copper.

* * * * *